United States Patent [19]
Patti

[11] Patent Number: 5,939,940
[45] Date of Patent: Aug. 17, 1999

[54] LOW NOISE PREAMPLIFIER FOR A MAGNETORESISTIVE DATA TRANSDUCER

[75] Inventor: Giuseppe Patti, San Jose, Calif.

[73] Assignee: STMicroelectronics, Inc., Carrollton, Tex.

[21] Appl. No.: 08/872,841

[22] Filed: Jun. 11, 1997

[51] Int. Cl.$^6$ .................................................. H03F 1/26
[52] U.S. Cl. ............................ 330/149; 330/252; 360/46
[58] Field of Search .................................. 330/149, 252, 330/69, 310, 311, 288, 296; 360/46, 67, 113

[56] References Cited

U.S. PATENT DOCUMENTS

| | | | |
|---|---|---|---|
| 4,356,453 | 10/1982 | Sueyoshi | 330/277 |
| 4,406,990 | 9/1983 | Noro | 330/296 |
| 4,499,431 | 2/1985 | Otala | 330/149 |

FOREIGN PATENT DOCUMENTS 0 595 266 A2   4/1994   European Pat. Off. .......... G11B 5/02

OTHER PUBLICATIONS

Klein, Hans W. and Robinson, Moises E. "A 0.8nV/√Hz CMOS Preamplifier for Magneto–Resistive Read Elements." IEEE Journal of Solid–State Circuits, vol. 29, No. 12, Dec. 1, 1994, pp. 1589–1595.

IBM Technical Disclosure Bulletin, vol. 38, No. 1, Jan. 1995, "Programmable Magnetoresistive Arm Electronics Performance for Disk Drives," pp. 111–112.

*Primary Examiner*—Robert Pascal
*Assistant Examiner*—Khanh Van Nguyen
*Attorney, Agent, or Firm*—Theodore E. Galanthay; Lisa K. Jorgenson; Robert D. McCutcheon

[57] ABSTRACT

A low noise preamplifier design which is configured such that the current through the first stage load resistor may be made relatively small in value making it possible to achieve a relatively large gain in the first stage thereby reducing the noise contribution of the load resistor and, concurrently, significantly reducing the noise contribution of the second stage as well. This is effectuated by supplying a substantially fixed amount of current to certain nodes in the first stage of the preamplifier through a pair of current sources, the currents being of an amount sufficient to subtract out the bias current that is applied through a series connected variable resistance, such as that of a magnetoresistive ("MR") read head. As a consequence, only a relatively small amount of current is actually fed through the load resistor, and its value may be increased to provide an increased gain for the first stage. Therefore, the noise contribution of the load resistor and the second stage may be rendered relatively negligible.

20 Claims, 2 Drawing Sheets

LOW NOISE PREAMPLIFIER FOR A MAGNETORESISTIVE DATA TRANSDUCER

BACKGROUND OF THE INVENTION

The present invention relates, in general, to the field of preamplifier circuit design. More particularly, the present invention relates to a low noise preamplifier for a magnetoresistive ("MR") data transducer, or "read" head which reduces the noise contributions of the load resistor in a first stage of the preamplifier in addition to lessening that noise otherwise contributed by the second gain stage of the preamplifier.

Magnetoresistive read heads are known to be useful in reading data encoded on a magnetic surface with a sensitivity exceeding that of inductive or other thin-film heads. In operation, an MR head is used to detect magnetic field signal changes from a magnetic surface due to the fact that the resistance of the MR sensor changes as a function of the direction and amount of flux being sensed. It is also generally known that for an MR transducer to function effectively, it must be subjected to a transverse bias field to linearize its response, in addition to a longitudinal bias to minimize Barkhausen noise. Various techniques for effectuating such transverse biasing are known, including current shunt biasing and soft adjacent film biasing. The transverse bias field is applied normal to the plane of the magnetic media and parallel to the surface of the MR sensor.

In current MR read head preamplifier design, the current through the head is fixed and a function of the resistance of the read head itself. As is known, a critical aspect of any preamplifier design is its noise figure, which, in the case of a conventional preamplifier design, is a function of the value of the load resistor ($R_L$). To a first approximation, the output noise due to RL is proportional to $1/\sqrt{R_L}$. Because in conventional circuit designs the total current through the MR read head is applied through $R_L$, it is not possible to merely increase the value of $R_L$ to reduce the output noise of the preamplifier without concomitantly increasing the voltage drop across $R_L$ to an undesirable level.

SUMMARY OF THE INVENTION

Disclosed herein is a low noise preamplifier design which overcomes the disadvantages inherent in prior designs and is configured such that the current through the load resistor may be made much smaller than previous designs. As such, it is possible to achieve a relatively large gain in the first stage of the low noise preamplifier thereby reducing the noise contribution of the load resistor and, concurrently, significantly reducing the noise contribution of the second stage as well.

This is effectuated by supplying a substantially fixed amount of current to certain nodes in the first stage of the preamplifier through a pair of current sources, the currents being of an amount sufficient to subtract out the bias current that is applied through the MR read head. As a consequence, only a relatively small amount of current is actually fed through the load resistor, and the value of $R_L$ may be increased to provide an increased gain for the first stage. Therefore, the noise contribution of the load resistor and the second stage may be rendered relatively negligible.

Particularly disclosed herein is a preamplifier which is coupled between first and second supply voltage lines and includes a switching device having first and second current carrying terminals and a control terminal thereof. A load resistance couples the first current carrying terminal of the switching device to the first supply voltage line and a variable resistance couples the second current carrying terminal of the switching device to the second supply voltage line. An output amplifier has a first input thereof coupled to the first current carrying terminal of the switching device and a second input thereof coupled to a reference voltage. The output amplifier presents at least one output providing an output signal of the preamplifier. A voltage input/current output amplifier also has first and second inputs thereof coupled to the first and second inputs of the output amplifier respectively, and has an output coupled to the control terminal of the switching device. The output of the voltage input/current output amplifier is capacitively coupled to the second supply voltage line. A first current source is provided for supplying a first substantially fixed current to the first current carrying terminal of the switching device; and a second current source supplies a second substantially fixed current to the variable resistance. In an exemplary embodiment, the variable resistance comprises an MR read head.

Also disclosed herein is a method for improving noise immunity in a preamplifier which includes series connected load, switching and variable resistance elements. The method comprises the steps of supplying a first relatively fixed current to a first circuit node intermediate the load and switching elements and supplying a second relatively fixed current to a second circuit node intermediate the switching and variable resistance elements.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
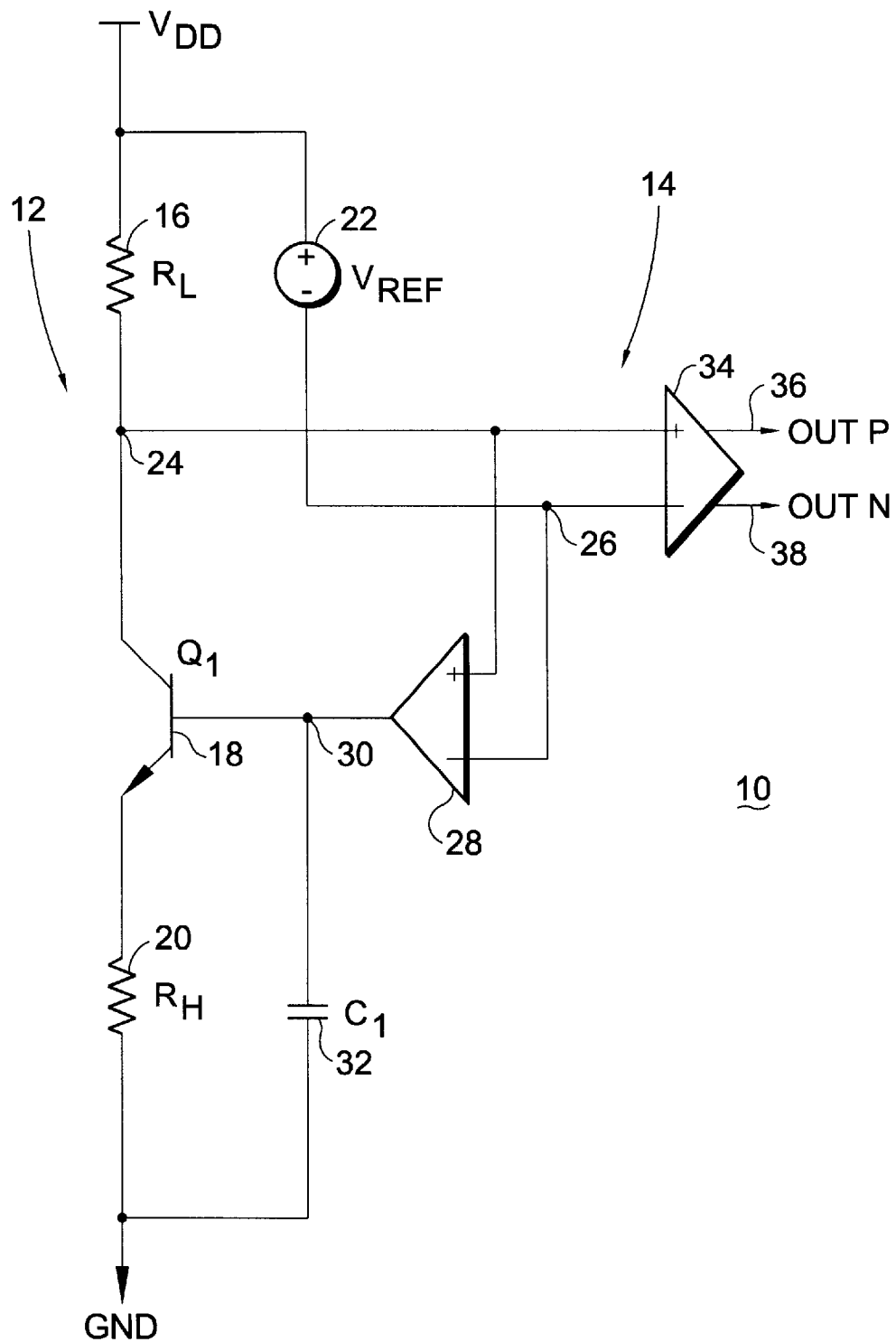
FIG. 1 is schematic diagram of a prior art MR read head preamplifier having a single-ended input and a differential output.

With reference now to FIG. 1, a prior art preamplifier 10 is shown. The prior art preamplifier 10 comprises, in pertinent part, first and second amplification stages 12, 14 coupled between a supply voltage source ("$V_{DD}$") and circuit ground ("Gnd"). The first stage 12 comprises a load resistor 16 ("$R_L$") coupling the collector terminal of a bipolar transistor 18 ("$Q_1$") to $V_{DD}$. The emitter terminal of transistor 18 is coupled to Gnd through the series connected variable resistance of an MR read head 20 ("$R_H$").

The second stage 14 includes a voltage source 22 ("$V_{REF}$") coupled between $V_{DD}$ and the negative ("−") input of a voltage input/current output amplifier 28, defined as node 26, which has its positive ("+") input coupled to node 24 between resistor 16 and the collector terminal of transistor 18. The output of amplifier 28 is coupled to the base terminal of transistor 18 to provide a drive current thereto defined as node 30. Node 30 is coupled to Gnd through capacitor 32 as shown. Nodes 24 and 26 are coupled to the positive and negative inputs of an additional differential output amplifier 34 respectively which presents corresponding differential outputs 36 ("Out P") and 38 ("Out N") for the prior art preamplifier 10.

The prior art preamplifier 10 illustrated is a conventional single-ended input, differential output design used as an MR read head 20 output signal amplifier. It incorporates appropriate transverse biasing of the associated MR read head 20 (represented by resistance $R_H$) into a linear range. The output signal voltage on outputs 36 and 38 is given by the equation:

$$V_{OUT} = R_L/R_H * A * V_{IN}$$

where A is the gain of amplifier 34 and $V_{IN}$ is the equivalent input signal in series with $R_H$.

In this design, the current through the MR read head 20 ($R_H$) is fixed and a function of the resistance of the head itself. The current through $R_H$ is approximately equal to $V_{REF}/R_L$ and it is possible to program this current value by changing $V_{REF}$ in accordance with the value of $R_H$. As is known, a critical aspect of any preamplifier design is its noise figure, which, in the case of the prior art preamplifier 10, is a function of the value of the load resistor 16 ($R_L$). The output noise due to RL is proportional to: $1/\sqrt{R_L}$. Due to the fact that the total current through the MR read head 20 is applied through $R_L$, it is not possible to increase the value of $R_L$ to reduce the output noise without concomitantly increasing the voltage drop across $R_L$ to an undesirable level.

Figure 2:
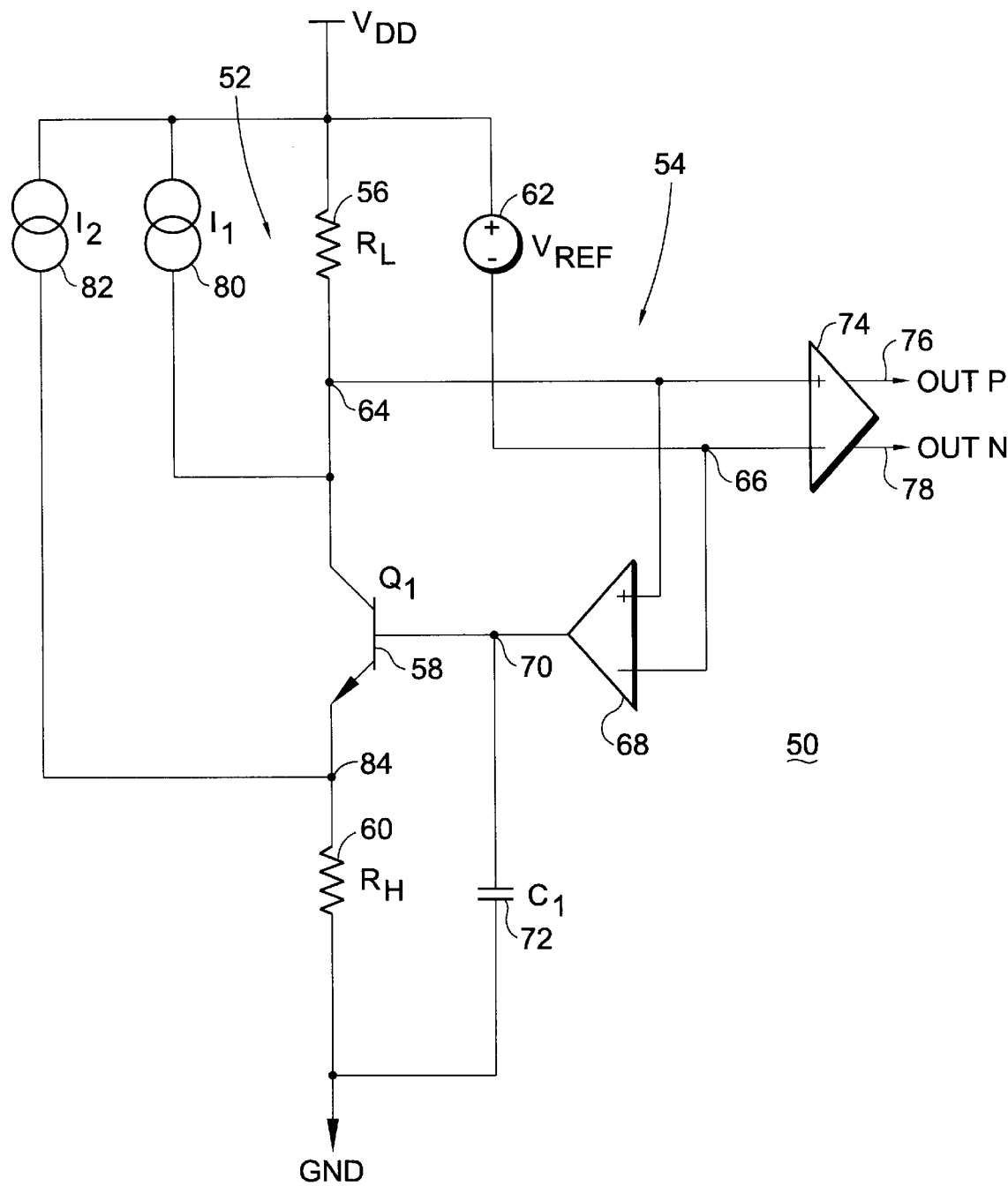
FIG. 2 is a corresponding schematic diagram of a low noise preamplifier in accordance with the present invention illustrating first and second additional current sources applied to the first stage of the preamplifier to reduce noise contribution of the load resistor and the second gain stage.

With reference now to FIG. 2, an embodiment of a low noise preamplifier 50 in accordance with the present invention is shown which overcomes the disadvantages of the prior art preamplifier 10 of FIG. 1. The preamplifier 50 comprises, in pertinent part, first and second amplification stages 52, 54 coupled between a supply voltage source and circuit ground. The first stage 52 comprises a load resistor 56 coupling the collector terminal of a an NPN bipolar transistor 58 to $V_{DD}$. In a preferred embodiment, the value of the load resistor 56 may be determined in accordance with the foregoing formula based upon the resistance of the MR read head 60 ($R_H$) and the transistor 58 may be conveniently furnished as any suitable NPN device. The emitter terminal of the transistor 58 is coupled to Gnd through the series connected variable resistance of an MR read head 60.

The second stage 54 includes a voltage source 62 coupled between $V_{DD}$ and the negative input of a voltage input/current output amplifier 68, (wherein $g_{M68} = \Delta I_{OUT}/\Delta V_{INPUT}$) defined as node 66, which also has its positive input coupled to node 64 between resistor 56 and the collector terminal of transistor 58. The output of amplifier 68 is coupled to the base terminal of transistor 58 to provide a drive current thereto defined as node 70. Node 70 is coupled to Gnd through capacitor 72 as shown. Nodes 64 and 66 are coupled to the positive and negative inputs of an additional differential amplifier 74 respectively which presents corresponding differential outputs 76 and 78 for the preamplifier 50. In a preferred embodiment, the amplifier 68 may be conveniently furnished as a voltage input/current output device as previously described wherein $g_{M68} = \Delta I_{OUT}/\Delta V_{INPUT}$ and the amplifier 74 is a voltage amplifier having a gain $A = g_{TOTAL}/[R_L/R_H]$. The capacitor 72 is selected to define the low frequency cut-off of the preamplifier 50 and is a function of $g_{M68}$.

The preamplifier 50 further comprises a first current source 80 ("$I_1$") coupled between $V_{DD}$ and node 64 in parallel with resistor 56 as well as a second current source 82 ("$I_2$") coupled between $V_{DD}$ and a node 84 defined by the emitter terminal of transistor 58, which second current source 82 is in parallel with both resistor 56 and series connected transistor 58. The relative ratio of the current sourced by the current sources $I_1$ and $I_2$ are a function of the resistance of the MR read head 60 ($R_H$).

With respect to preamplifier 50, it can be seen that the current through the load resistor 56 ($R_L$) may be made much smaller than that in the prior art preamplifier 10 of FIG. 1. As such, it is possible to achieve a relatively large gain in the first stage 52 (comprising resistor 56, transistor 58 and MR read head 60) thereby reducing the noise contribution of the load resistor 56 ($R_L$) and, concurrently, significantly reducing the noise contribution of the second stage 54 as well.

In the design for the preamplifier 50 shown, a fixed amount of current is supplied to the circuit through the current sources 80 and 82 of an amount sufficient to subtract out the bias current that is applied through the MR read head 60. As a consequence, only a relatively small amount of current is actually fed through the load resistor 56. Therefore, the value of $R_L$ may be increased to provide an increased gain for the first stage 52. As a consequence, the noise contribution of the load resistor 56 and the second stage 54 may be made relatively negligible.

While there have been described above the principles of the present invention in conjunction with a specific circuit design and components, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A preamplifier coupled between first and second supply voltage lines comprising:

a switching device having first and second current carrying terminals and a control terminal thereof;

a load resistance coupling said first current carrying terminal of said switching device to said first supply voltage line;

a variable resistance coupling said second current carrying terminal of said switching device to said second supply voltage line;

an output amplifier having a first input thereof coupled to said first current carrying terminal of said switching device and a second input thereof coupled to a reference voltage, said output amplifier having at least one output providing an output signal of said preamplifier;

a voltage input/current output amplifier having first and second inputs thereof coupled to said first and second inputs of said output amplifier respectively, said voltage input/current output amplifier having an output coupled to said control terminal of said switching device and being capacitively coupled to said second supply voltage line;

a first current source for supplying a first substantially fixed current to said first current carrying terminal of said switching device; and a second current source for supplying a second substantially fixed current to said variable resistance.

2. The preamplifier of claim 1 wherein said switching device comprises a bipolar transistor.

3. The preamplifier of claim 2 wherein said bipolar transistor comprises an NPN device.

4. The preamplifier of claim 3 wherein said first and second current carrying terminals and said control terminal comprise collector, emitter and base terminals respectively.

5. The preamplifier of claim 1 wherein said load resistance comprises a resistor having a value selected as a function of said variable resistance.

6. The preamplifier of claim 1 wherein said variable resistance comprises a magnetoresistive element.

7. The preamplifier of claim 6 wherein said magnetoresistive element comprises an MR read head.

8. The preamplifier of claim 1 wherein said output amplifier comprises a voltage amplifier.

9. The preamplifier of claim 8 wherein said at least one output of said output amplifier comprises a pair of differential outputs.

10. The preamplifier of claim 1 wherein said voltage input/current output amplifier comprises a differential amplifier.

11. The preamplifier of claim 1 wherein said first current source supplies a current selected as a function of said variable resistance.

12. The preamplifier of claim 1 wherein said second current source supplies a current selected as a function of said variable resistance.

13. The preamplifier of claim 1 wherein said output of said voltage input/current output amplifier is capacitively coupled to said second supply voltage line by a capacitor selected as a function of a cut-off frequency of said preamplifier.

14. The preamplifier of claim 1 wherein said voltage input/current output amplifier has a gain which is a function of a change in an output current divided by a change in an input voltage of said preamplifier.

15. The preamplifier of claim 1 wherein said output amplifier has a gain which is a function of said load resistance divided by said variable resistance.

16. A method for improving noise immunity in a preamplifier including series connected load, switching and variable resistance elements, said method comprising the steps of:

supplying a first relatively fixed current to a first circuit node intermediate said load and switching elements; and also supplying a second relatively fixed current to a second circuit node intermediate said switching and variable resistance elements whereby the first and second currents provide an amount of current for biasing the variable resistance element without the amount of current flowing through the load element.

17. The method of claim 16 wherein said steps of supplying and also supplying are carried out by said first and second relatively fixed currents having a level which is a function of a resistance of said variable resistance element.

18. The method of claim 16 wherein said step of supplying is carried out by a first current source.

19. The method of claim 16 wherein said step of also supplying is carried out by a second current source.

20. The method of claim 16 wherein said variable resistance comprises an MR read head.

* * * * *